United States Patent [19]

Arsena et al.

[11] Patent Number: 5,738,219
[45] Date of Patent: Apr. 14, 1998

[54] PROTECTIVE PLASTIC PACKAGE FOR PRINTED CIRCUIT BOARDS

[75] Inventors: Biagio Arsena; Randall C. Gordon, both of Durham; Steve D. Tadge, Hillsborough, all of N.C.; Anthony H. J. Robinson, Richmond Hill, Canada

[73] Assignee: Northern Telecom Limited, Montreal, Canada

[21] Appl. No.: 807,682

[22] Filed: Feb. 28, 1997

Related U.S. Application Data

[60] Provisional application No. 60/012,974, Mar. 7, 1996.

[51] Int. Cl.⁶ .................. B65D 85/30; B65D 43/16
[52] U.S. Cl. .................. 206/706; 206/723; 220/339
[58] Field of Search .................. 206/449, 454, 206/508, 509, 511, 701, 706–709, 722–724; 220/337, 339; 439/521, 519, 76.1, 595, 596

[56] References Cited

U.S. PATENT DOCUMENTS

| 3,256,975 | 6/1966 | Puente | 206/706 |
| 5,303,820 | 4/1994 | Comtois | 206/706 |
| 5,323,898 | 6/1994 | Kester | 206/709 |
| 5,375,710 | 12/1994 | Hayakawa et al. | 206/724 |
| 5,450,959 | 9/1995 | Philippi | 206/706 |

Primary Examiner—Paul T. Sewell
Assistant Examiner—Luan K. Bui
Attorney, Agent, or Firm—Foley & Lardner

[57] ABSTRACT

Protective molded resilient flexible plastic package for a printed circuit board with a base and a cover member. The base and cover members have border regions with locking elements to detachably hold base and cover together to close the package. The border regions of one member has a wall which defines a step surface for contacting a marginal region of a surface of the board and a projection spaced from the step surface to engage the other surface of the board when this is in contact with the step surface. The other member has a rigid board engaging element for engaging the other surface of the board when the package is closed.

5 Claims, 3 Drawing Sheets

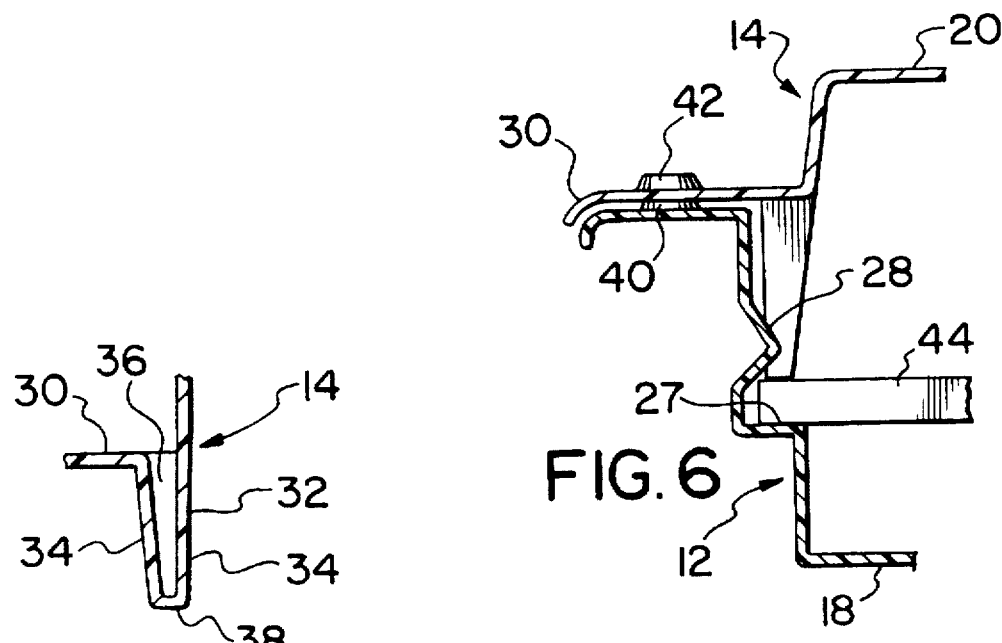
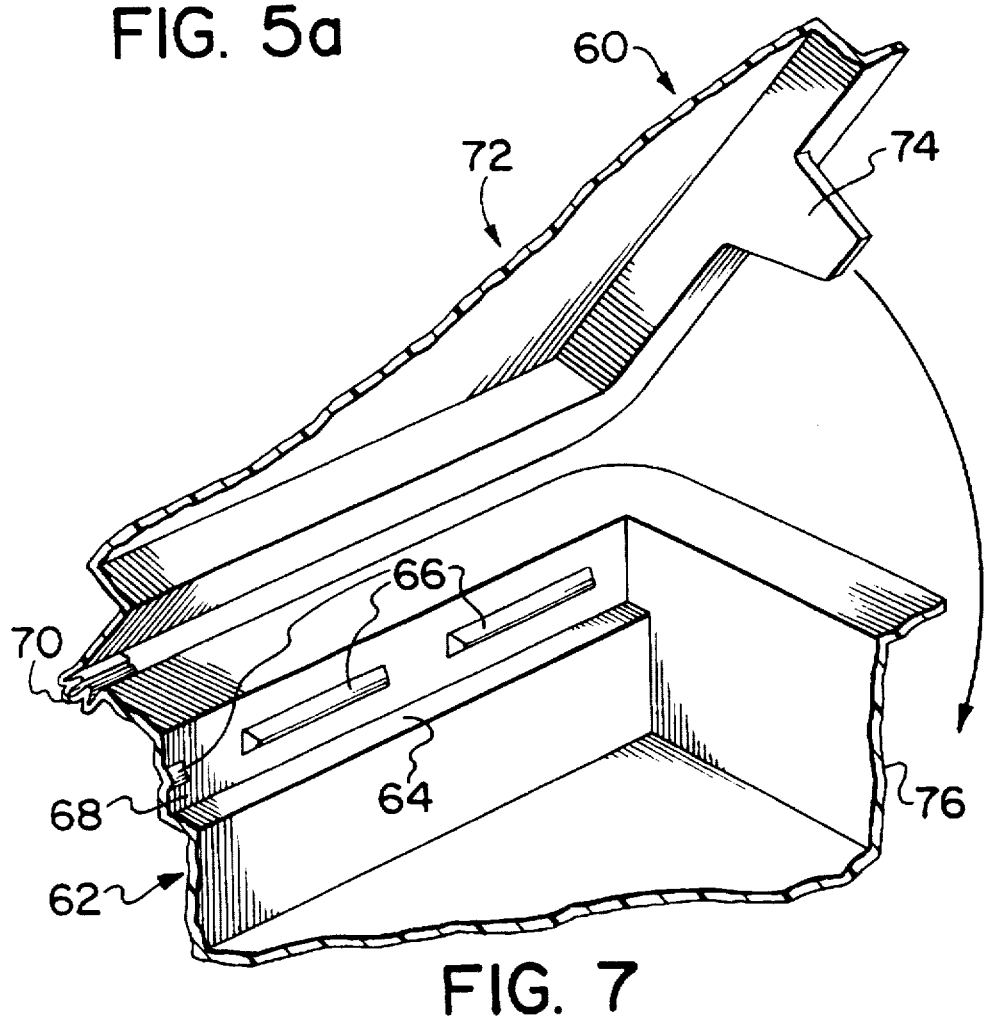

PROTECTIVE PLASTIC PACKAGE FOR PRINTED CIRCUIT BOARDS

This application claims the benefit of U.S. Provisional application Ser. No. 60/012,974, filed on Mar. 7, 1996.

This invention relates to protective plastic packages for printed circuit boards.

Protective packages for printed circuit boards are well known in the art. These are used for transporting and storage of printed circuit boards and are intended to protect the boards both from physical damage due to impact loads or due to vibration for instance, against environmental conditions, and also against being subjected to the damaging effects of static electricity. A standard procedure for shipping purposes is to dispose packages containing printed circuit boards in stacked or side-by-side relationship so that the packages support each other within a general rigid box construction. It is found that while known packages are expected to fulfill all of the above requirements, nevertheless a great many designs of packages do not perform satisfactorily in at least one of the areas, particularly in the area of preventing physical damage. For instance, some of the packages which are at present used allow for movement of printed circuit boards within the packages during vibration and impact load conditions and thereby result in damage either to the boards or to electronic components carried thereon.

The present invention seeks to provide a protective plastic package for a printed circuit board which minimizes the chances of electrical or physical damage being caused to the board held within the package.

Accordingly, the present invention provides a protective molded resiliently flexible plastic package for a printed circuit board comprising a base member and a cover member which are detachably closeable together to define an enclosed chamber for containing and securely holding a printed circuit board, each member having a generally planar main chamber defining portion and a border region around the main chamber defining portion, the border regions of the two members comprising mutually engageable locking means to detachably hold the members together in their closed condition, the border region of one member having a chamber boundary wall extending from edges of and out of the plane of its main chamber defining portion, the wall defining a step surface for contacting a marginal region of one major surface of the board and a resiliently deflectable projection spaced from the step surface to engage a marginal edge region of the other major surface of the board with the board contacting the step surface, the other member having a substantially rigid board engaging element which, with the members closed together, lies within the chamber in a position to engage the marginal edge region of the other major surface.

With structures according to the invention, the base and cover members are held closed together by the locking means with the marginal edge regions of the two major board surfaces sandwiched between the members. The structure is found to satisfactorily protect printed circuit boards during recognized vibration tests and also affords adequate protection against damage during drop testing procedures. A reason for this is partly that the wall of the one member when subjected to shock, carries the load of the PCB through the step surface so as to be absorbed in a first general direction into the wall and also into the main chamber defining portion of that member. In the opposite i.e. second general direction, load applied by the PCB is absorbed through the resiliently deflectable projection and into the wall away from the printed circuit board. The reason is also partly due to the fact that the load applied by the PCB to the package is carried in the second general direction through the board engaging element and into the main chamber defining portion of the other member. The load is further absorbed and dissipated by the interengaged locking means at the border regions. It follows that the load of the printed circuit board is carried fully by the package structure in the direction of load application and any tendency of the printed circuit board to move out of contact with the step surface is successfully resisted by the board engaging element.

The invention is particularly useful for making resiliently flexible packages of exceptional thinness in comparison to their size and in comparison to the size and weight of the printed circuit boards which they are intended to carry. For instance, a package defining a chamber sufficiently large to contain a printed circuit board having major surface dimensions in the region of 11×14 inches, may be made with a thickness down to 25 mil and perhaps less while providing the physical protection required. The package according to the invention is particularly suitable for making by vacuum forming techniques which enables the extreme thinness of the product to be achieved. In particular structures, the board engaging element may be formed as a localized tooth to engage, at a free end of the tooth, the associated marginal edge region of the board. When making the package by vacuum molding techniques, the tooth which may be extremely thin in material section, e.g. 25 mil, and may be made sufficiently strong and rigid for its printed circuit board holding requirements, by forming it as a box shape with an open end, the tooth extending away from the plane of its main chamber defining portion to the closed end for engaging the marginal edge portion of the board.

In certain package constructions according to the invention, it is convenient to provide a series of longitudinally spaced resiliently deflectable projections, the series being spaced from the step surface. A plurality of spaced board engaging elements in the form of teeth are also provided and these are disposed alternately with the projections longitudinally of the step surface when the base and cover members are closed together. The structure is particularly useful with a package of relatively large size having comparable lengths of step surface so that the load applied by the printed circuit board may be distributed by the projections and the board engaging elements into the members. Alternatively, in smaller package constructions, a single or a plurality of projections maybe provided by certain walls of one of the members while a single or plurality of board engaging elements possibly in the form of teeth, may be provided by the other member in a position spaced from the projections. Conveniently, the package may be made from a material, e.g. polyvinylchloride, which may be reclaimed and reused for forming new packages of the invention, preferably by vacuum forming. This and other possible materials are also environmentally friendly and are usable successfully to ground static charges without causing damage to the contained printed circuit board or its electronic components.

Embodiments of the invention will now be described, by way of example, with reference to the accompanying drawings, in which:

FIG. 5a is a cross-sectional view along line Va—Va in FIG. 4;

FIG. 6 is a view taken in the direction of FIG. 5 upon the part of the closed package while containing a printed circuit board; and FIG. 7 is an isometric view of part of a package according to a second embodiment.

Figure 1:
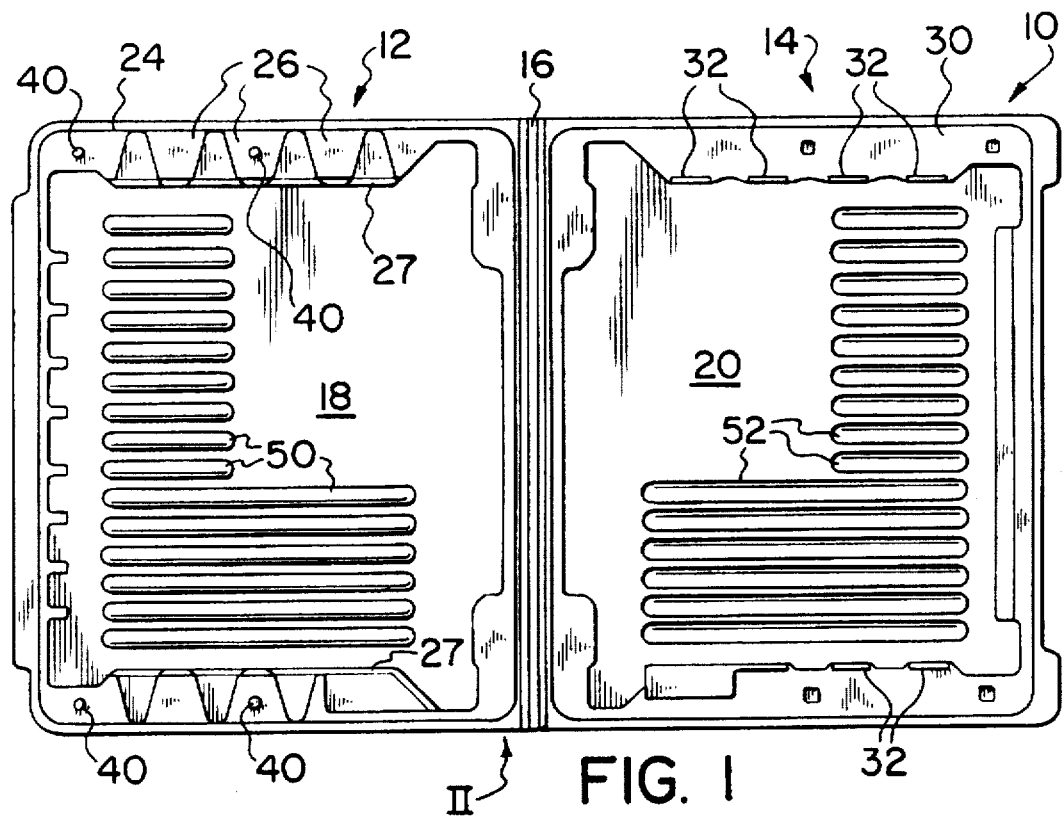
FIG. 1 is a plan view of a protective plastic package for a printed circuit board according to a first embodiment.
Figure 2:
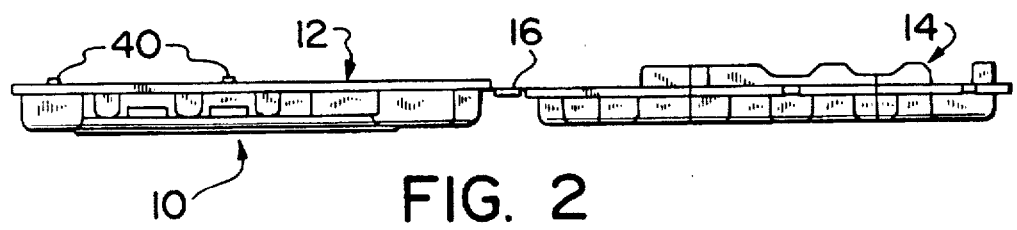
FIG. 2 is a view in the direction of arrow II in FIG. 1 of the package.
Figure 3:
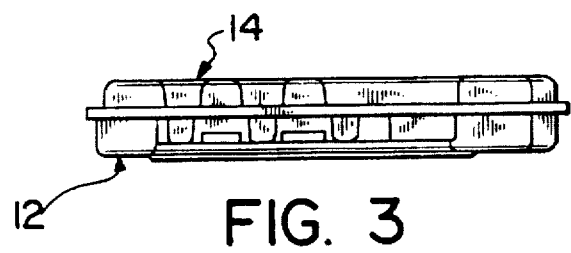
FIG. 3 is a view similar to FIG. 2 showing the package in a closed condition.
Figure 4:
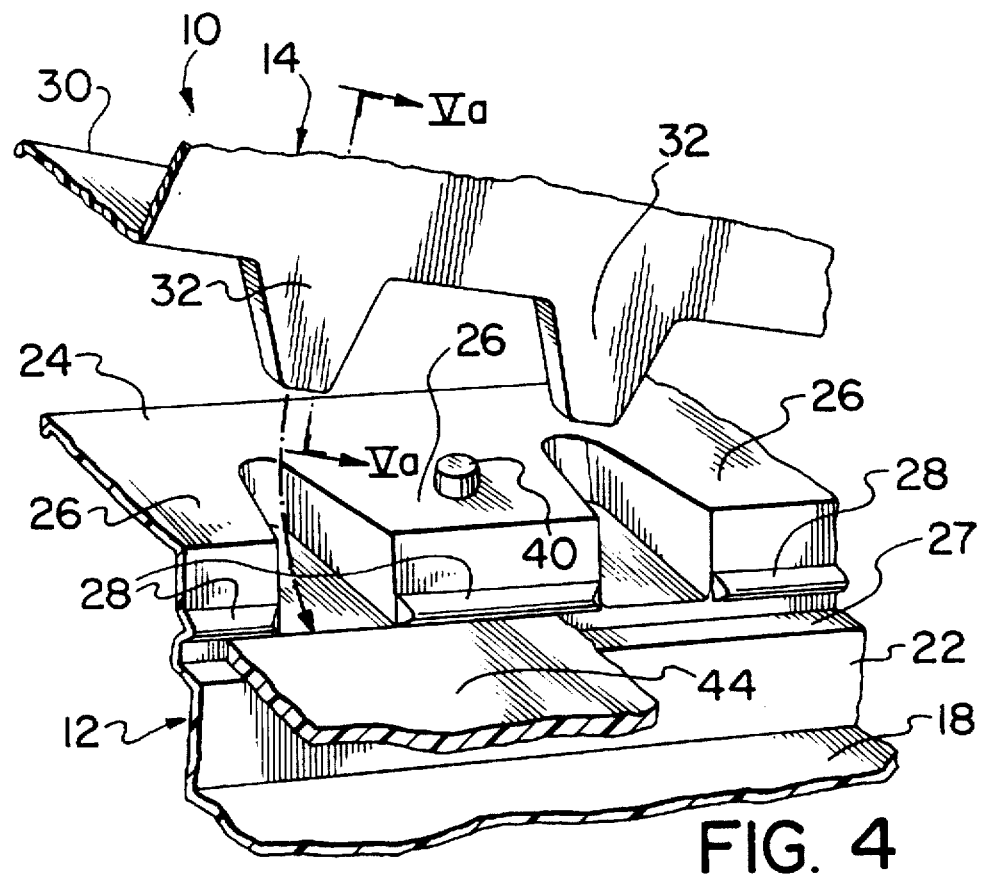
FIG. 4 shows relative positions of parts of the package during the closing operation.

As shown in FIGS. 1 and 2, a package 10 for a printed circuit board is resiliently flexible and is formed from polyvinylchloride sheet by vacuum forming into a suitable mold. The package 10 is formed integrally of a base member 12 and a cover member 14 which are interconnected along adjacent edges by a hinge structure 16. The dimensions of the two members 12 and 14 are approximately 13 inches and 15.5 inches for containing a printed circuit board and mounted electronic components, the board being of approximate dimensions of 11×14 inches. Each member has a general thickness of about 25 mil. Base member 12 is vacuum formed with a generally planar main chamber defining portion 18 while the cover member 14 is formed with a similar main chamber defining portion 20 (FIG. 1). The base member 12, as is shown in FIGS. 2 and 3, but more particularly in FIGS. 4, 5 and 6, has a border region comprising a wall means in the form of a wall 22 which surrounds the chamber defining portion 18 and extends outwardly from the plane of the portion 18 to terminate at a further end of the wall in a buttressed region having a surrounding flange 24. The wall 22 of the base member 12 is strengthened by formation of the buttresses 26 (see FIG. 4 particularly) which are spaced apart by opposing walls of the main chamber defining portion 18 with the top surfaces of the buttresses facing upwards together with the flange 24. As shown in FIG. 1, but particularly in FIGS. 4, 5 and 6, the wall 22 of the base member 12 has along two sides provided with the buttresses, a step surface 27 for supporting a marginal edge region of one of the major surfaces of the printed circuit board. These parts of the wall are also provided with a series of spaced resiliently deflectable projections 28 which are longitudinally in line and are provided at bases of the buttresses 26 so as to overlie slightly and be spaced from the step surface 27 a distance sufficient to engage and hold a marginal edge region of the other major surface of the board when this is carried upon the step surface as will be described.

The cover member 14 also has border regions in the form of flanges 30 spaced from and lying generally parallel to the plane of the main chamber defining portion 20. In addition to this, the cover member 14 is formed with a plurality of board engaging elements in the form of teeth 32 which are spaced apart along two opposite sides of the main chamber defining portion 20, which sides correspond to the sides of the base member 12 having the step surfaces 27. As seen from FIGS. 5 and 5a, each of the teeth 32 is formed during the vacuum forming process, as a box formation with an open end to the flange 30 and a closed end which is directed away from the main chamber defining portion 20. This vacuum formed box formation construction provides a certain strength and rigidity to each of the teeth 32 whereby while the structure may conveniently be formed from exceedingly thin polyvinylchloride material (25 mil) for holding a printed circuit board in position, nevertheless it has the required strength for holding the printed circuit board in place upon the step surface 27 as will be explained.

Figure 5:
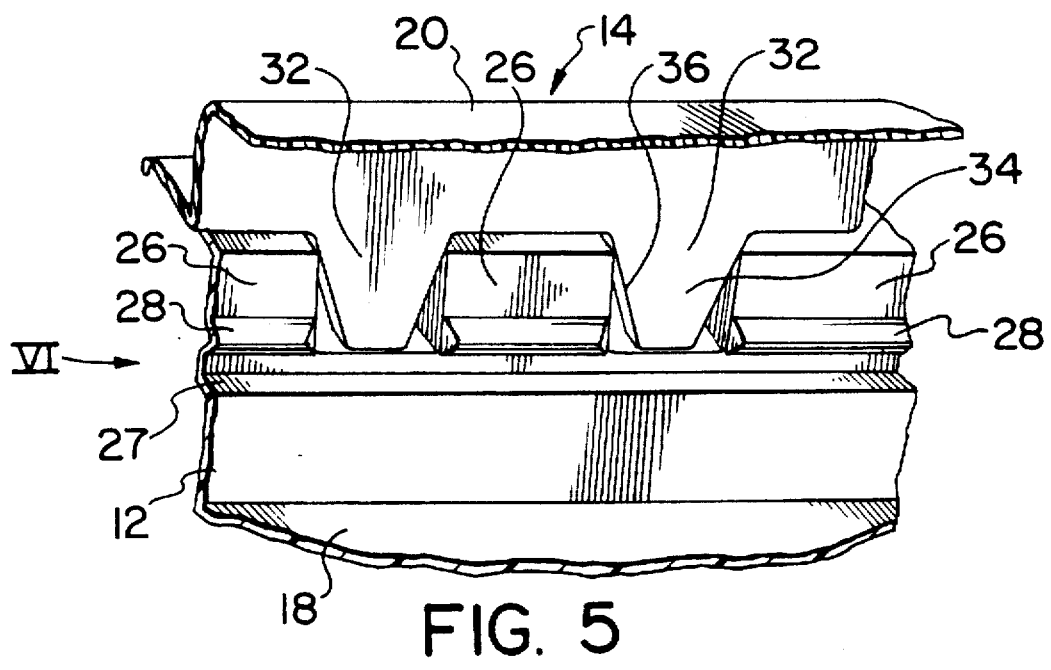
FIG. 5 is an isometric view of part of the package of the first embodiment in a closed position.

As seen from FIGS. 5 and 5a, each tooth has two main planar walls 34 which lie close together and are integrally joined by two narrow walls 36. The rigidity is completed by the closed end wall 38.

The package 10 may be closed by folding the cover member 14 over the base member 12 along the hinge 16 into its closed position as shown in FIG. 3. A locking means is provided for holding the package in its closed position and this locking means comprises a plurality of resiliently flexible upward localized projections 40 molded at the top surfaces of the buttresses 26, these projections being receivable within receptors 42 molded into resilient parts of the flange 30 of the cover member 14.

In use, a printed circuit board 44, possibly carrying electronic components (not shown) is carried by a marginal edge region of one major surface of the board upon the two opposite step surfaces 26 (FIGS. 5a and 6). To locate the printed circuit board in this position, edges of the board first engage with the projections 28 so as to deflect them out of position by deflection of the wall 22, the wall and the projections returning to their original positions with the board in its seating position. Hence, the projections 28 project over the edge of the board and may actively engage and be deflected by a corner of the printed circuit board as shown in FIG. 6.

The cover member 14 is then closed over the printed circuit board into the FIG. 3 position. During this movement, each set of teeth 32 swings downwardly as indicated by the arrow in FIG. 4 so as to occupy a space generally between the spaced ends of adjacent projections 28 so as to alternate along the two respective sides of the wall 22 with the projections 28 in the final structure. In this position the locking means 40 and 42 are interengaged for instance as shown in FIG. 6.

In use, while the material of the package is exceedingly thin (e.g. 25 mil) for the size of package and the size and weight of the board which it is to protect, nevertheless the structure of the package is sufficient for it to have adequate strength to hold the board securely and safely in position upon the sealing surfaces 26 whether or not the package is subjected to an impact load, e.g. by dropping, or under vibrational forces. The reason for this is partly that when the load of the board acts against the step surfaces 27, i.e. downwardly in FIG. 6 then the load is absorbed into each of the steps, into the lower part of the walls 22 and thence into the main chamber defining portion 18 of the structure. When the load from the board is applied in the opposite direction, it is dispersed partly through the projections 28 and into the upper part of the wall 22 to the surrounding flange 24. To prevent the board from moving upwardly under a sufficient load to deflect the projections 28 thereby causing removal of the board from its seating position, the teeth 32 are of sufficient length so as to engage the marginal edge regions of the top major surface of the board. The rigidity and strength of the box formation teeth 32, although these are of extreme thinness, is sufficient to prevent deflection of the teeth under load whereby the board is retained in position. The load is transmitted by these teeth into the flange structure 30 and is dispersed between the two opposing flanges through the locking means and also into the main chamber defining portion 20.

As may be seen therefore from the first embodiment, the structure of the package has large outer dimensions for supporting a large board construction and is extremely thin while still being capable, because of its design features, for holding the printed circuit board in its desired seating position while preventing damage to the board either during storage, moving or shipping when it may be subjected to impact or vibrational loads. The package is environmentally friendly, being formed from a material, e.g. polyvinylchloride or similar, which may be reclaimed for a manufacture of further packages according to the invention as and when required. The package is also suitable for dispersing static electricity around the package and away from the printed circuit board and its mounted electronic components thereby preventing electrical damage occurring to the circuitry.

Further, as may be seen from FIG. 1, the main chamber defining portions 18 and 20 are formed respectively with parallel vacuum formed ribs 50 and vacuum formed recesses 52 in their outer surfaces. When a plurality of packages 10 are stacked either for storage or shipping purposes then the ribs 50 of one package fit conveniently within the recesses 52 of an adjacent package. This assists in transferring loads from package to package in the stack together with transfer of static electricity to ground. In addition, one or each of the base and cover members is formed with a clear transparent area such as area 54 for purposes of designation of relevant information concerning the board structure. Alternatively, or in addition, other areas (not shown) are transparent for the purpose of viewing a contained printed circuit board to read an appropriate bar code carried by the circuit board construction.

In a second embodiment as shown in FIG. 7, in a vacuum formed plastic package 60 for a printed circuit board which is smaller in size than the package 10, the board engaging elements of this package are not provided along walls of the cover member which correspond to walls of the base member having the resilient deflectable projections and step surface. In contrast, the base member 62 has a step surface 64 and resiliently deflectable projections 66 similar to the projections 28 and step surface 27 in the first embodiment. These features are provided along a wall portion 68 provided with a hinge 70. The cover member 72 however has only two board engaging elements in the form of teeth 74 (one being shown) which are disposed at opposite sides of the cover member, these sides extending away from the hinge 70 so as to be closely opposed to wall portions 76 of the base member which actually extend away from the wall portion 68. In the second embodiment the printed circuit board (not shown) when mounted within the package would be seated upon the step surface 64 under the projections 66 and the teeth members 74 would engage the top surface of the board.

What is claimed is:

1. A protective molded resiliently flexible plastic package for a printed circuit board comprising a base member and a cover member, the cover and base members being closeable to define an enclosed chamber for containing and securely holding a printed circuit board, each member having a generally planar main chamber defining portion and a border region around the main chamber defining portion, the border regions of the two members comprising mutually engageable locking means to detachably hold the members together in their closed condition, the border region of one member having a chamber boundary wall extending from edges of and out of the plane of its main chamber defining portion, the wall defining a step surface for contacting a marginal region of one major surface of the board and a resiliently deflectable projection spaced from the step surface to engage a marginal edge region of the other major surface of the board when this lies in contact with the step surface, and the other member having a substantially rigid board engaging element which, with the members closed together, lies within the chamber in a position to engage the marginal edge region of the other major surface.

2. A package according to claim 1 provided with a series of longitudinally spaced resiliently deflectable projections along one wall region, the series spaced from the step surface which also extends along the one wall region, and a plurality of spaced board engaging elements in the form of teeth which, with the members in closed condition, extend alternately with the projections longitudinally of the step surface with free ends of the teeth spaced from the step surface to engage the marginal edge portion of the other major surface of the printed circuit board.

3. A package according to claim 1 wherein in the one member the wall terminates away from the associated main chamber defining portion in flange means and a flange means is also provided upon the other member, the locking means being resiliently interengageable and provided in appropriate positions for locking purposes upon the flange means of the members the flange members confronting each other with the members close together.

4. A package according to claim 1 made by vacuum forming.

5. A package according to claim 4 wherein the board engaging element is formed by vacuum forming and is of box formation with a first end which is open and a second end which is closed, the second end for engaging the printed circuit board, and the box formation provides strength and rigidity to the board engaging element.

* * * * *